United States Patent [19]

Lu

[11] Patent Number: 5,733,150

[45] Date of Patent: Mar. 31, 1998

[54] LOW PROFILE LIF PGA SOCKET

[75] Inventor: Sidney Lu, Taipei, Taiwan

[73] Assignee: Hon Hai Precision Ind. Co., Ltd., Taipei, Taiwan

[21] Appl. No.: 629,554

[22] Filed: Apr. 9, 1996

[51] Int. Cl.$^6$ .................................................. H01R 13/10
[52] U.S. Cl. ........................................................ 439/682
[58] Field of Search .............................. 439/682–685, 439/10, 82, 83, 444, 856, 857, 871–873

[56] References Cited

U.S. PATENT DOCUMENTS

| | | | |
|---|---|---|---|
| 5,399,108 | 3/1995 | Lu et al. | 439/682 |
| 5,518,426 | 5/1996 | Playner | 439/682 |

Primary Examiner—Khiem Nguyen

[57] ABSTRACT

A socket connector (10) for receiving a pin type component (11) therein, comprises an insulative housing (12) having a plurality of cavities (14) extending therethrough in a vertical direction. Each cavity (14) comprises an upper portion (32) and a lower portion (34) wherein the upper portion (32) includes a counter sink and the lower portion (34) includes a generally rectangular hole generally formed by the first, second, third and fourth interior surfaces (38, 46, 48, 50). A pair of engagement blocks (36) are formed on the upper corners, and a shallow (40) is recessed inward from the first interior surface (38) and a pair of slots (44) are recessed inward from the opposite second and third interior surface (46, 48). A plurality of contacts (18) are respectively received within such plural cavities (14) wherein each contact (18) is of a plate-like shape, includes a main body (20) having retention barbs (22) on two sides and a generally triangular resilient section (26) with an expansion section (28) at the top for engagement with the inserted pin (13) of the component (11) and for engagement with the engagement blocks (34) for preloading consideration before the pin (13) of the component (11) is mated.

3 Claims, 6 Drawing Sheets

5,733,150

1
LOW PROFILE LIF PGA SOCKET

BACKGROUND OF THE INVENTION

1. Filed of the Invention

The invention relates to the socket type connector receiving the pin type component therein, and particularly to the socket having properly structurally configured cavities therein for cooperation with the inserted pins of the component.

2. The Prior Art

PGAs (Pin Grid Arrays) have been popularly used in the computer for the past few years. For receiving the PGAs, there are two types of sockets wherein the first is in a form of ZIF (Zero Insertion Force) using a sliding plate associated with the cam lever for receiving the PGA therein, and the other is in a form of LIF (Low Insertion Force) using a simplex housing for supportably receiving the PGA therein as show in U.S. Pat. No. 5,399,108. From a technical viewpoint, the former is much better than the latter, but is much inferior to the latter from consideration of cost. The invention is to provide a LIF PGA socket for receiving the corresponding PGA therein.

An object of the invention is to provide a LIF PGA socket having a simplified structure or easy manufacturing and good engagement with the inserted pins of the component.

SUMMARY OF THE INVENTION

According to an aspect of the invention, a socket connector for receiving a pin type component therein, comprises an insulative housing having a plurality of cavities extending therethrough in a vertical direction. Each cavity comprises an upper portion and a lower portion wherein the upper portion includes a counter sink and the lower portion includes a generally rectangular hole formed by the first, second, third and fourth interior surfaces. A pair of engagement blocks are formed on the two upper corners, and a shallow is recessed inward from the first interior surface and a pair of slots are recessed inward from the opposite second and third interior surfaces. A plurality of contacts are respectively received within such plural cavities wherein each contact is of a plate-like shape, includes a main body having retention barbs on two sides and a generally triangular resilient section with an expansion sections at the top for engagement with the inserted pin of the component and for engagement with the engagement blocks for preloading consideration before the pin of the component is mated.

2

Figure 1:
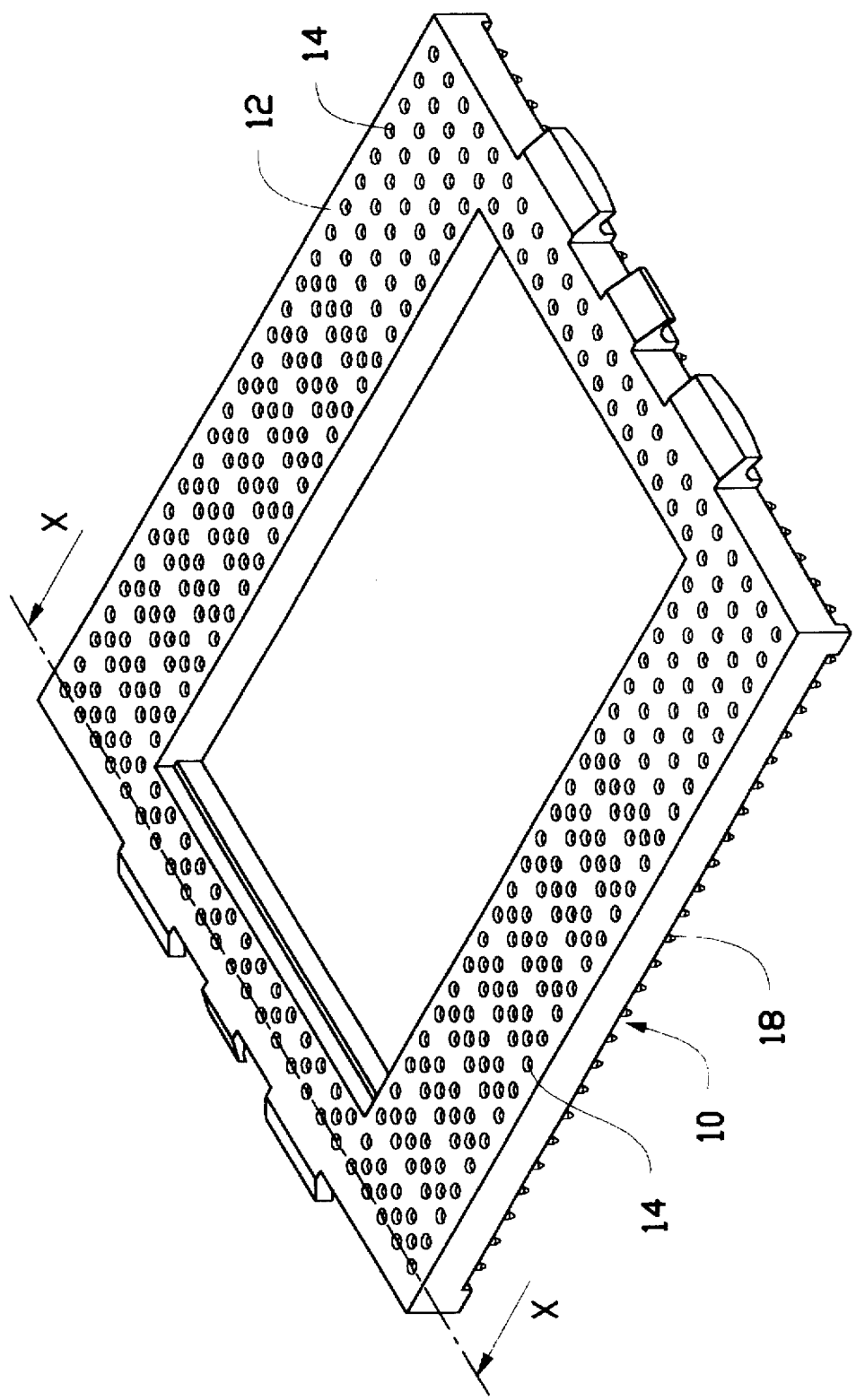
FIG. 1 is a perspective view of a presently preferred embodiment of the LIF PGA socket connector according to the invention.

FIG. 4(C) is a partial top view of the housing of the connector of FIG. 1 to show the relations among the internal structures of the cavity.

Figure 5:
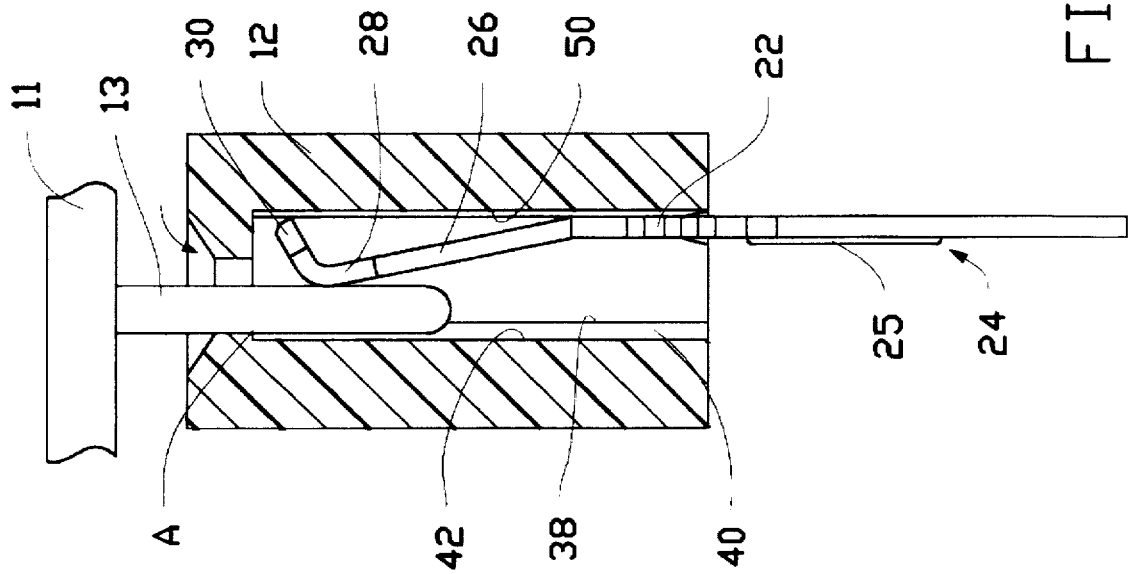

FIG. 5 is a partially cross-sectional view of the housing of the connector of FIG. 1 with the pin of the component inserted in the cavity to show how the contact engages the inserted pin of the component.

DETAILED DESCRIPTION OF THE PREFERRED EMBODIMENT

References will now be made in detail to the preferred embodiments of the invention. While the present invention has been described with reference to the specific embodiments, the description is illustrative of the invention and is not to be construed as limiting the invention. Various modifications to the present invention can be made to the preferred embodiments by those skilled in the art without departing from the true spirit and scope of the invention as defined by appended claims.

Figure 2:
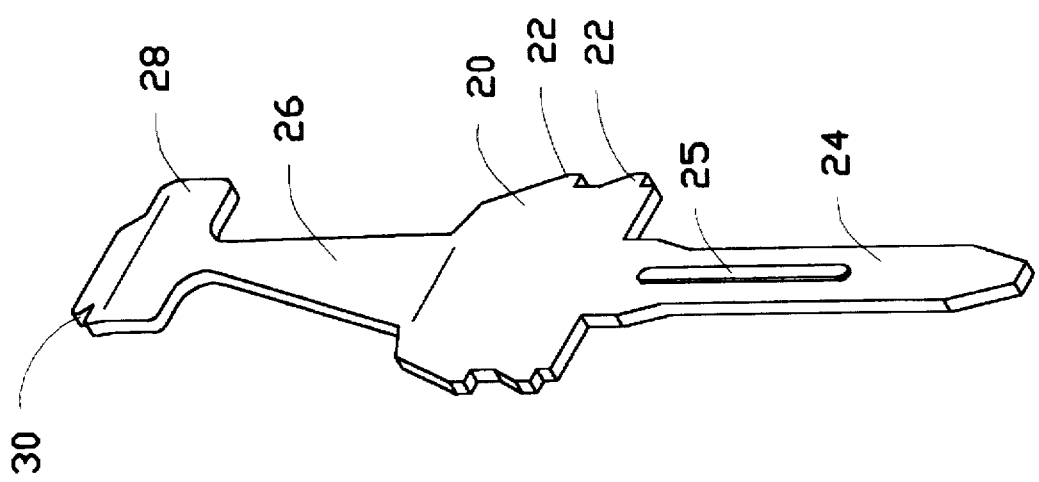
FIG. 2 is a perspective view of the contact for use within the connector of FIG. 1.
Figure 3:
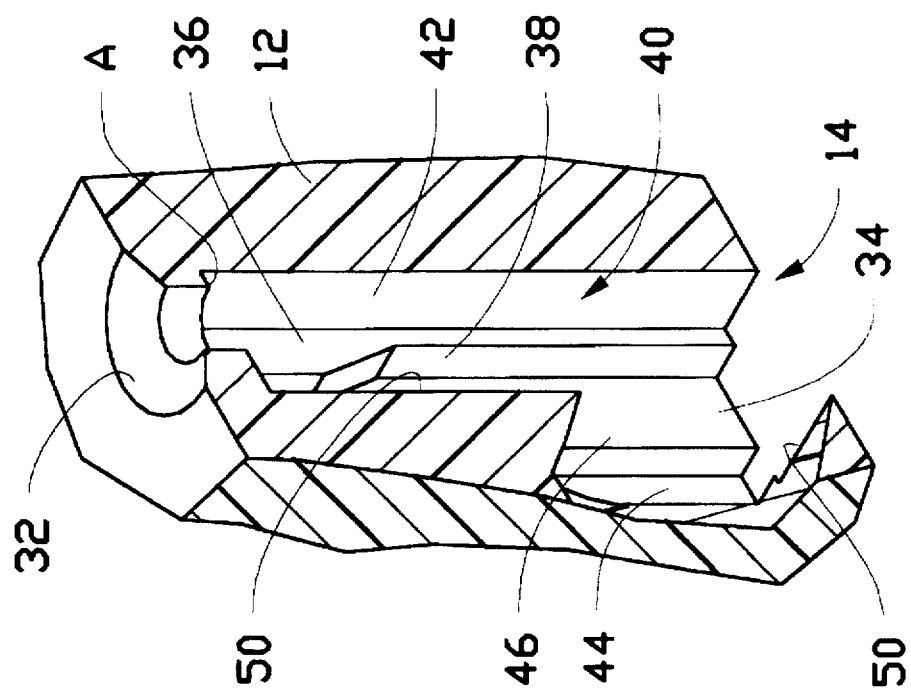
FIG. 3 is a fragmentary perspective view, generally cut away along line X—X in FIG. 1, of the housing of the connector of FIG. 1 to show the internal structure in the cavity.

It will be noted here that for a better understanding, most of like components are designated by like reference numerals throughout the various figures in the embodiments. Attention is directed to FIGS. 1–3 wherein a socket connector 10 for use with a pin type component 11, includes an insulative housing 12 having a plurality of cavities 14 extending therethrough in a vertical direction for receiving a corresponding number of contacts 18 therein.

Referring to FIG. 2, each contact 18 is generally in a form of plate-like shaped including a main body 20 having retention barbs 22 on two side edges, a tail section 24 downward extending from the main body 20, and a triangular resilient section 26 integrally extending upward and obliquely from the main body 20 with an expansion section 28 at the end thereof. The expansion section 28 includes a diverging tip 30 for ease of the insertion of the contact 18 with regard to the housing 12 from the bottom or ease of insertion of the pin type component 11 with regard to the connector 10 from the top. A reinforcement rib 25 is formed on the tail section 24 for enhancement consideration.

Figure 4:
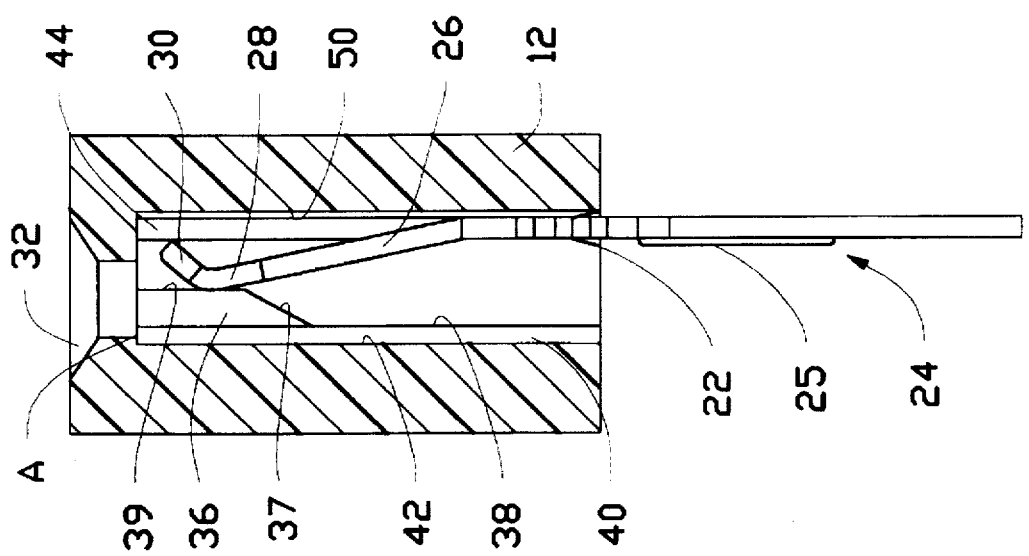
FIG. 4(A) a partially cross-sectional view of the housing of the connector of FIG. 1 with the contact therein to show how the contact is received within the corresponding cavity.
FIG. 4(B) is another partially cross-sectional view of the housing of the connector of FIG. 1 with the contact therein to show how the contact is received within the corresponding cavity.
Figure 4:
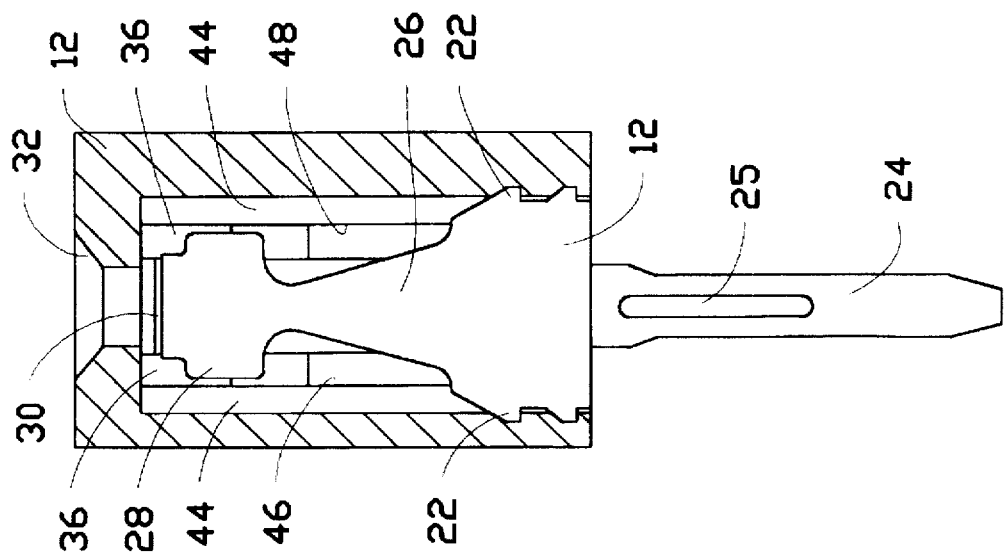
Figure 4:
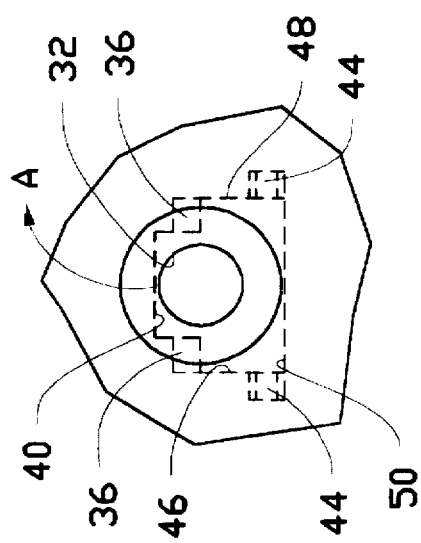

Referring to FIGS. 3–5, corresponding to the contact 18, each cavity 14 comprises an upper portion 32 in a form of counter sink, and a lower portion 34 in a form of rectangular parallelepiped. A pair of engagement blocks 36 (only one shown in FIG. 3) are formed at two opposite upper corners on the first inner surface 38 so that the expansion section 28 of the corresponding contact 18 may engage thereon for preloading consideration when the pin 13 of the component 11 has not been inserted into the cavity 14. Thus, the preloading performance of the contacts 18 allows an easy insertion of the pin 13 of the component 11 while still keeps the required normal force against the inserted pin 13 after the pin 13 has been inserted into the cavity 14.

A shallow 40 is recessed from the first surface 38 for receiving the inserted pin 13. It is noted that the bottom surface 42 of the shallow 40 is substantially horizontally offset from the closest Point A of the circumference for forgiving the possible misalignment of the pin 13 with regard to the center of the counter sink type upper portion 32. Thus, the shallow 40 will help loading the component 11, particularly for those having non-exactly-aligned pins thereof, to the connector 10.

A pair of slots 44 are formed on the second surface 46 and the third surface 48 in the cavity 14 for interferentially receiving the retention barbs 22 of the main body 20 of the contact 18 so that the contact 18 can be retained within the cavity 14 of the housing 12. It is noted that the fourth surface 50 of the cavity 14 is substantially spaced from the two adjacent slots 44 in a normal direction of the main body 20 of the contact 18, so that the main body 20 of the contact 18 is not engaged against the fourth surface 50, and thus the whole structure of the contact 18 is more resilient and flexible in the cavity 14 for compliance with the inserted pin 13 of the component 11. This space between the main body 20 of the contact 18 and the fourth surface 50 also allows a relatively larger manufacturing tolerance in dimensions of the contact 18 or the cavity 14.

When assembled, referring to FIGS. 4(A) and 4(B), the contacts 18 are loaded into the housing 12 from the bottom wherein the expansion section 28 of each contact 18 may move along the slanted surface 37 of the engagement block 38 and stop at the engagement surface 39 of the engagement block 38. Under this condition, the retention barbs 28 of the main body 20 of the contact 18 also move along the slots 44 and all are embedded within the slots 44 for interferential retention. Eventually, only the tail section 24 is exposed out of the housing 12.

When the component 11 is loaded onto the housing 12, referring to FIG. 5, the pin 13 of the component 11 can be inserted into the corresponding cavity 14 of the housing 12 from the top through the upper portion 32 and contacts the diverging tip 30 of the expansion section 28 of the contact 18. Successively, the expansion section 28 is pushed to move laterally by the inserted pin 13 of the component 11 via deflection of the resilient section 26 of the contact 18. Finally, the component 11 is substantially seated on the housing 12, and the pins 13 are respectively properly mechanically and electrically engaged with the contacts 18 in position. Therefore, the invention provides a LIF PGA socket connector which is easy to manufacture or assemble, and also easy and reliable to be operated with the loaded component 11.

While the present invention has been described with reference to specific embodiments, the description is illustrative of the invention and is not to be construed as limiting the invention. Various modifications to the present invention can be made to the preferred embodiments by those skilled in the art without departing from the true spirit and scope of the invention as defined by the appended claims.

Therefore, persons of ordinary skill in this field are to understand that all such equivalent structures are to be included within the scope of the following claims.

We claim:

1. A socket connector for receiving an electrical component having a plurality of pins extending downward therefrom, comprising:

an insulative housing including a plurality of cavities extending therethrough vertically for receiving a corresponding number of contacts therein;

each cavity generally including an upper portion in a form of counter sink, and a lower portion in a form of rectangular parallelepiped surrounded by a first pair of opposite first and fourth surfaces, and a second pair of opposite second and third surfaces;

each of said contact including a main body, a resilient section extending upwardly and inwardly from the main body of the contact with an expansion section at a distal end, said expansion section being engaged with a pair of engagement block formed on upper corners of the first surface of the cavity; and a shallow recessed from the first surface for forgiving misaligned pin of the component for easy loading of the component with regard to the socket connector.

2. The socket connector as described in claim 1, wherein the main body has retention barbs on two sides for being interferentially received within a pair of retention slots formed on the second and the third inner surfaces of the corresponding cavity.

3. The socket connector as described in claim 2, wherein the fourth surface is offset from the adjacent retention slots in a normal direction of the main body of the contact for providing more flexibility of the contact and allowing larger tolerances between the contact and the housing.

* * * * *